(12) United States Patent
Sahara et al.

(10) Patent No.: US 6,650,675 B2
(45) Date of Patent: Nov. 18, 2003

(54) TUNABLE LASER DEVICE FOR AVOIDING OPTICAL MODE HOPS

(75) Inventors: Richard T. Sahara, Watertown, MA (US); Randal A. Salvatore, Waltham, MA (US); Hanh Lu, North Andover, MA (US)

(73) Assignee: Corning Lasertron, Incorporated, Bedford, MA (US)

( * ) Notice: Subject to any disclaimer, the term of this patent is extended or adjusted under 35 U.S.C. 154(b) by 81 days.

(21) Appl. No.: 10/037,458

(22) Filed: Nov. 9, 2001

(65) Prior Publication Data

US 2003/0091086 A1 May 15, 2003

(51) Int. Cl.$^7$ ................................................. H01S 3/19
(52) U.S. Cl. ............................ 372/50; 372/43; 359/344
(58) Field of Search ............................. 372/50, 45, 43; 359/344

(56) References Cited

U.S. PATENT DOCUMENTS

| | | | | |
|---|---|---|---|---|
| 4,705,361 A | * | 11/1987 | Frazier et al. | 359/263 |
| 4,719,636 A | | 1/1988 | Yamaguchi | 372/50 |
| 5,548,607 A | | 8/1996 | Tsang | |
| 5,793,521 A | * | 8/1998 | O'Brien et al. | 359/344 |
| 6,028,881 A | | 2/2000 | Ackerman et al. | 372/75 |
| 6,104,739 A | * | 8/2000 | Hong et al. | 372/50 |
| 6,108,469 A | | 8/2000 | Chen | 385/24 |
| 6,122,299 A | | 9/2000 | DeMars et al. | 372/20 |
| 6,400,744 B1 | * | 6/2002 | Capasso et al. | 372/96 |
| 2003/0007719 A1 | * | 1/2003 | Forrest et al. | 385/14 |

OTHER PUBLICATIONS

Thedrez, B., et al., "1.3μm tapered DFB lasers for isolator-free 2.5 Gbits all-optical networks," OPTO+, Groupement d'Intérêt Economique, Alcatel Corporate Research Center, Marcoussis, France. No Date.

Xing-sha, Zhou and Peida, Ye, "Intensity Noise of Semiconductor Laser In Presence Of Arbitrary Optical Feedback," Electronics Letters, 25 (7) : 446–447 (1989).

Schunk, N. and Petermann, K., "Measured Feedback-induced Intensity Noise for 1.3μm DFB Laser Diodes," Electronics Letters, 25 (1) : 63–64 (1989).

Favre, F., "Sensitivity to External Feedback For Gain-Coupled DFB Semiconductor Lasers," Electronics Letters, 27 (5) : 433–435 (1991).

(List continued on next page.)

*Primary Examiner*—Paul Ip
*Assistant Examiner*—Dung Nguyen
(74) *Attorney, Agent, or Firm*—Juliana Agon

(57) ABSTRACT

An integrated semiconductor device comprising a wavelength-tunable laser, such as a distributed Bragg reflector (DBR) laser, where the laser has a gain section that includes an active layer, and a grating section that includes an active layer and a current-induced grating. A first electrical contact is provided over the gain section to supply current to the gain section and control the output power of the light, and a second electrical contact is provided over the grating section to supply current to the grating section and control the wavelength of the emitted light. The current-induced grating of the present device causes gain in the active layer of the laser to be modulated spatially in the direction of light propagation, thus resulting in only one of the degenerate Bragg modes to oscillate. As the degeneracy of the Bragg modes is broken by current-injection, and not facet reflection, substantially continuous wavelength tuning is possible without the deleterious phenomenon of "mode hopping." The present design does not utilize a phase section, and thus eliminates the complex three-way interaction between the gain section, grating section, and a phase section. Alternative grating designs include gain-coupled gratings, complex-coupled gratings, and fractional wave shifted gratings, with relatively strong coupling products (κL>1.5), which do not rely on facet reflections to break the degeneracy of the Bragg modes.

40 Claims, 8 Drawing Sheets

OTHER PUBLICATIONS

Nakano, Y., et al., "Resistance to External Optical Feedback in a Gain–Coupled Semiconductor DFB Laser," University of Tokyo, Bunkyo–ku, Tokyo 113, Japan. No Date.

"QLM6S891, 2mW 1625nm OSC Source DFB Laser", Product Brochure, Corning Incorporated, One Riverfront Plaza, Corning, NY 14831–0001 (2001).

* cited by examiner

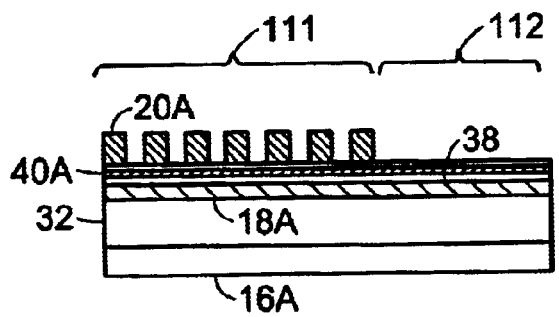
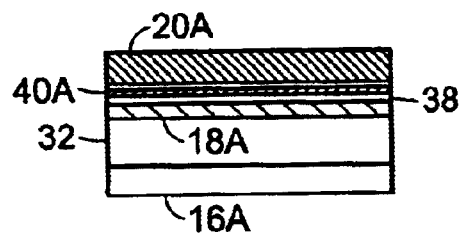
FIG. 8A  FIG. 8B
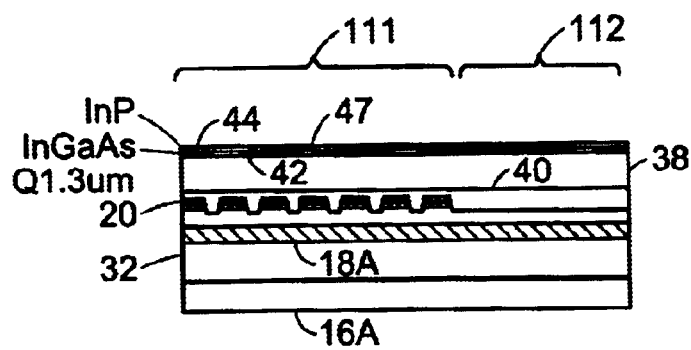
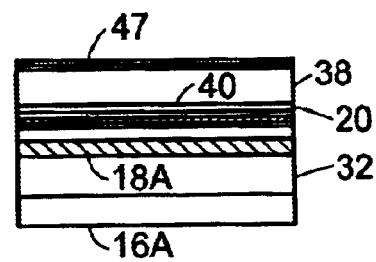
FIG. 9A  FIG. 9B
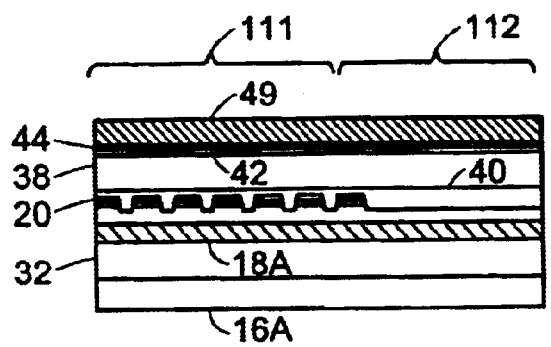
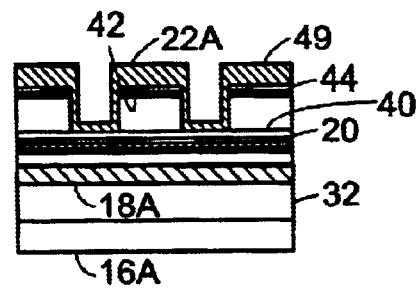
FIG. 10A  FIG. 10B

TUNABLE LASER DEVICE FOR AVOIDING OPTICAL MODE HOPS

RELATED APPLICATION(S)

This application is related to U.S. patent application Ser. No. 10/037,461 entitled DISTRIBUTED FEEDBACK LASER FOR ISOLATER-FREE OPERATION, by Richard Sahara, Angela Hohl-Abichedid, and Hanh Lu filed on even date herewith. The entire teachings of the above application are incorporated herein by reference.

BACKGROUND OF THE INVENTION

Wavelength-tunable semiconductor laser devices are widely employed in optical communication systems. The distributed Bragg reflector (DBR) laser is one type of wavelength-tunable laser that utilizes a periodic grating structure within the laser cavity to provide wavelength selectivity. Generally, the DBR has a gain section, which includes an active layer, and a grating section, which includes an active layer and a Bragg grating. The power of the output light from the DBR is controlled by current injection into the gain section, and the wavelength of the output light is controlled by current injection into the grating section.

One challenge for DBR laser design has been achieving a device with the stable, single longitudinal mode output desired for today's moderate and long distance fiber optic communication applications. In a conventional DBR laser, the grating structure introduces a periodic modulation of the refractive index or gain within the laser cavity. This promotes the formation of two standing waves in the cavity (180° out of phase with each other), often referred to as the degenerate Bragg modes. In order to achieve single-mode emission, the degeneracy must be "broken" so that only one of the Bragg modes will be pumped. Typically, the degeneracy is broken by reflections from the facets of the laser cavity, which promote laser oscillation of just a single Bragg mode.

As the DBR laser is wavelength-tuned, the phase relationship between the degenerate Bragg modes and the reflected facet light is altered. This change in phase relationship can cause the reflected light from the output facets to favor oscillation of a different Bragg mode, thus causing the laser output light to jump intermittently between Bragg modes during tuning. This "mode hopping" results in an unstable and unpredictable device, and can make continuous wavelength tuning impossible.

The problem of "mode hopping" in a DBR is typically eliminated by the inclusion of a third section of the laser device, specifically a phase section. FIG. 1 illustrates such a device, wherein the DBR contains a phase section 13 disposed between the gain section 12 and the grating section 11. Through proper biasing of the phase section 13 relative to the gain and grating sections 12, 11, the phase relationship between the degenerate Bragg modes and the facet reflections may be maintained in such a manner as to prevent mode hopping.

The three-section design necessitates complex coordination between the grating, gain, and phase sections of a DBR laser. For stable operation at desired power and wavelength conditions, microprocessors are typically used with factory-set memory conditions to carefully control the current to each of the three sections. Extensive testing and characterization are required for each device in order to determine the proper biasing conditions for each desired power and wavelength operation.

SUMMARY OF THE INVENTION

In general, the present invention relates to high-performance wavelength-tunable semiconductor laser devices for optical communication applications. Mode hopping can be advantageously avoided without the added expense and complexity of a phase section. Furthermore, complex control electronics are no longer required for balancing the current to three contacts in order to avoid mode hops, and overall device operation is greatly simplified.

Accordingly, an integrated semiconductor device comprises a wavelength-tunable laser on a substrate, where the laser has a gain section that includes an active layer, and a grating section that includes an active layer and a current-induced grating. A first electrical contact is provided over the gain section to supply current to the gain section and control the output power of the light, and a second electrical contact is provided over the grating section to supply current to the grating section and control the wavelength of the emitted light. According to one aspect, the wavelength-tunable laser is a distributed Bragg reflector (DBR) type laser.

The current-induced, or current injection grating of the present device causes gain in the active layer of the laser to be modulated spatially in the direction of light propagation, thus resulting in only one of the degenerate Bragg modes to oscillate. As the degeneracy of the Bragg modes is broken by current-injection, and not facet reflection, substantially continuous wavelength tuning is possible without the deleterious phenomenon of "mode hopping." The present approach does not utilize a phase section, and thus eliminates the complex three-way interaction between the gain section, grating section, and a phase section.

The current-induced grating can be, for instance, a gain-coupled, or complex-coupled grating. In general, the grating strength is permitted to be strong relative to the facet reflections. In contrast to conventional index-coupled designs, grating structures having κL products greater than 1.5, and typically between about 3 and 6, are employed, where κ ($cm^{-1}$) is a coupling coefficient relating to the extent that light is coupled backward over the distributed length of the laser cavity, and L (cm) is the length of the cavity.

In addition to the current-induced, or current-injection grating structures described above, the device may utilize alternative grating structures, including other gain-coupled, complex-coupled, and fractional wave shifted designs, with relatively strong coupling products (κL>1.5), which do not rely on facet reflections to break the degeneracy of the Bragg modes.

The integrated semiconductor device of the invention may include a directly modulated laser, or a laser coupled with an external modulator for forming the optical signals. For instance, the device may comprise a laser and an electroabsorption modulator (EML), or a Mach Zehnder modulator, integrated on a single substrate.

The invention further relates to methods for fabricating an integrated semiconductor device, comprising the steps of forming on a substrate a wavelength-tunable laser having a grating section adjacent to a gain section, the grating section having an active layer and a current-induced grating, and forming electrical contacts over each of the grating and gain sections.

BRIEF DESCRIPTION OF THE DRAWINGS

FIGS. 8A, 8B to 10A, 10B illustrate side and front facet views, respectively, of process steps for fabricating a DBR device of the present invention.

Figure 1:
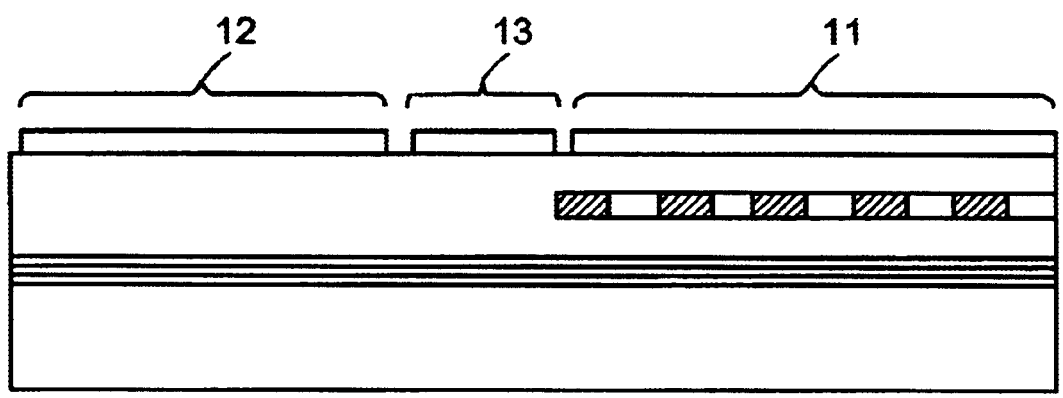
FIG. 1 is a cross-sectional view of a prior art DBR laser having a grating section, a gain section, and a phase section.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 2:
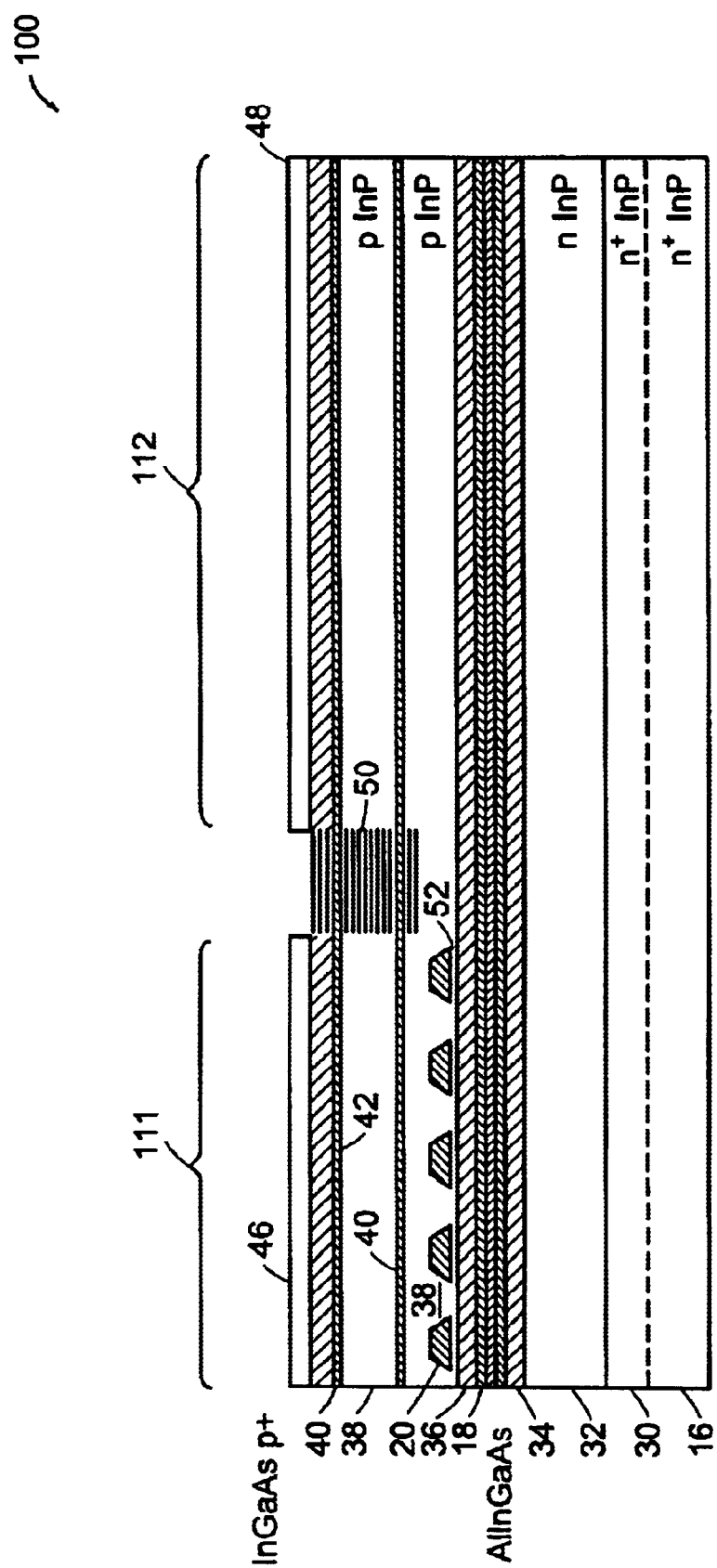
FIG. 2 is a cross-sectional view of a distributed Bragg reflector (DBR) type laser having a grating section and a gain section according to the present invention.

Turning now to the drawings, FIG. 2 is a cross-sectional view of a semiconductor laser device 100 having a grating section 111 adjacent to a gain section 112. The device is constructed on a substrate 16, which, according to this embodiment, comprises n+-type indium phosphide (InP). Above the substrate 16 is buffer layer 30 that is n+-type InP.

In succession above the buffer layer 30 are a lower cladding layer 32, a lower carrier confinement layer 34, an active layer 18, an upper carrier confinement layer 36 and an upper cladding layer 38. The lower and upper cladding layers 32, 38 provide optical confinement and are preferably of InP of n-type and p-type, respectively. The lower and upper carrier confinement layers 34, 36 confine the holes and electrons in the active layer 18 and are preferably of aluminum indium gallium arsenide (AlInGaAs). The active layer 18 is a multiple quantum well (MQW) structure that is also of AlInGaAs. The MWQ structure includes a succession of wells and potential barriers ranging from 4 to 20. The strain of the wells and barrier materials is compensated to improve the gain, carrier injection efficiency, and material reliability.

Alternative materials for forming the active layer 18 include InGaAsP, InGaAs, and AlGaNAs.

A periodic Bragg grating structure 20 is formed in a portion of the upper cladding layer 38 in the grating section 111. The Bragg grating is a three level structure of InP/InGaAsP/InP, periodically spaced along the length of the cavity.

The grating structure shown in FIG. 2 is a complex-coupled grating, where the grating structure provides periodic modulation of both refractive index and gain within the laser cavity. The refractive index modulation is introduced by the selection of a narrow band gap (e.g. 1.1 $\mu$m) grating material 20, having a different index than the surrounding material 38. The gain modulation results from the difference in conductivity or in band gap between the InGaAsP grating structure and the surrounding InP cladding layer. As this grating structure is located just above the active layer 18, current injection causes the gain of the active layer to be modulated spatially in the direction of light propagation. This selectivity of current flow causes only one of the degenerate Bragg modes to be pumped. In the embodiment shown in FIG. 2, the spacing 52 between the grating and upper carrier confinement layer is on the order of 0.1 $\mu$m to provide the current-injection complex-coupling.

The resulting layered structure of the laser 100 provides a DBR type laser that confines light generated in the active layer 18 primarily within an optical waveguide including the active, carrier confinement, Bragg grating and cladding layers. The resonant cavity extends throughout the grating section 111 and the gain section 112. The grating structure 20 is localized within the grating section 111.

Upper etch-stop layer 40 of InGaAsP, can be formed within the upper cladding layer 38. This layer can serve to define the depth of a ridge-waveguide structure, as shown in FIG. 10B, for instance.

Above the upper cladding layer 38 is provided, in succession, band gap transition layer 42 of InGaAsP, and an electrical contact layer 44 of p+-type InGaAs. Metal contact 46 provides the electrical contact for the grating section 111, and metal contact 48 provides the electrical contact for the gain section 112. In operation, contacts 46, 48 are forward biased.

A proton implantation region 50 may optionally be provided between the grating section 111 and gain section 112 to provide electrical isolation between the two regions. Hydrogen, helium, iron, or carbon, for instance, may be used for implantation.

Figure 3:
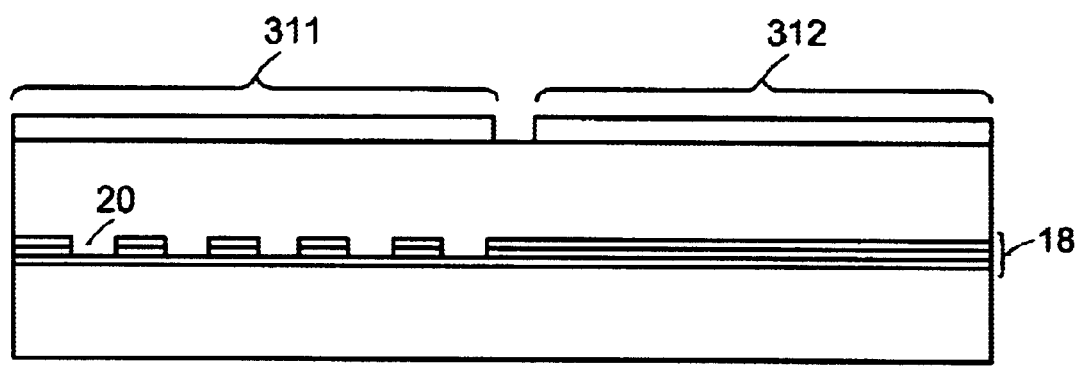
FIG. 3 is a cross-sectional view of a DBR device having a grating structure that is produced by etching the active layer.

In addition to the current-induced, or current injection grating described above, alternative grating designs for a DBR laser can also be employed, including other complex-coupled designs, as well as gain-coupled and fractional wave-shifted grating configurations. FIG. 3 shows one embodiment of a gain-coupled grating wherein portions of the active layer 18 have been removed through etching, and replaced with a grating material 20. In operation, the etched active layer provides a periodic modulation of gain within the active region that promotes laser oscillation in only one degenerate Bragg mode. Single-mode output can be achieved without reliance on reflections from output facets to break the degeneracy of the Bragg modes.

A complex-coupled grating, having both gain and index-coupled components, may also be produced through a periodic etch of the active layer of the DBR laser where the grating material 20 that is formed over the etched active layer has a different refractive index than that of the active layer material.

Figure 3A:
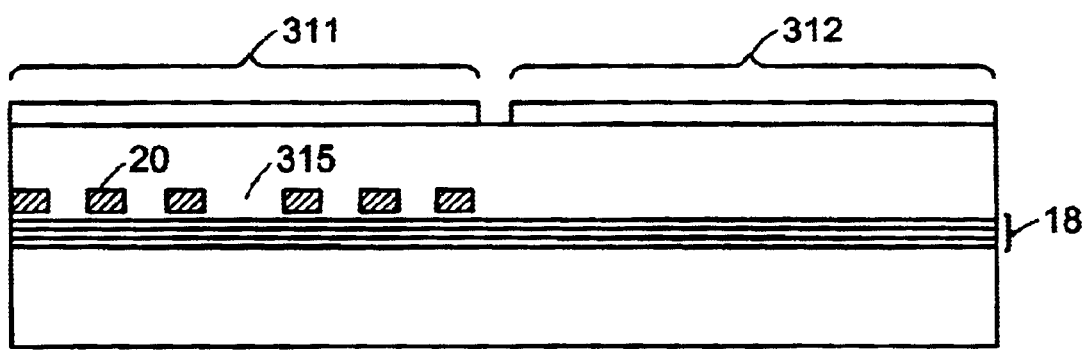
FIG. 3A is a cross-sectional view of a DBR device having a fractional wave-shifted grating structure according to the principles of the present invention.

A fractional wave-shifted grating, such as a quarter wave shifted grating, can also be utilized in the DBR laser in order to break the degeneracy of the Bragg modes. As shown in FIG. 3A, the grating elements 20 are not spaced in a strictly periodic manner, but instead include a fractional phase shift (e.g. ¼ for a quarter wave shifted grating) located at the center 315 of the grating section 311. The phase shift promotes oscillation in only one of the Bragg modes. The fractional wave-shifted design could be used in a conventional index-coupled laser, as well as in a gain coupled or complex coupled embodiment. As in the case of the gain-coupled and complex-coupled lasers described above, the DBR having a fractional wave-shifted grating does not rely on facet reflections to select a single Bragg mode.

The use of complex-coupled, gain-coupled and fractional wave shifted grating structures allows for relatively strong gratings for the DBR laser of the present invention. The strength of the Bragg grating is typically characterized in terms of its coupling strength coefficient, κL, where κ ($cm^{-1}$) is a coupling coefficient relating to the extent that light is coupled backward over the distributed length of the laser cavity, and L (cm) is the length of the cavity. For conventional index-coupled DBR lasers that require facet reflection to break the degeneracy of the Bragg modes, κL products between 0.5 and 1.5 are preferred. Weaker κL products (<0.5) do not provide the selectivity for single-mode output, while stronger values (>1.5) can render the facet reflections insufficient to break the degeneracy of the modes.

The DBR lasers of the present invention can be designed with gratings that are significantly stronger relative to conventional index-coupled designs. In general, the κL product for DBR lasers of the present invention is greater than 1.5, and typically between about 3 and 6. These higher κL product gratings permit even greater control over the wavelength of the output light. However, strong gratings also result in lower slope efficiency, and thus the tradeoff between wavelength control and output power should be considered.

Figure 4:
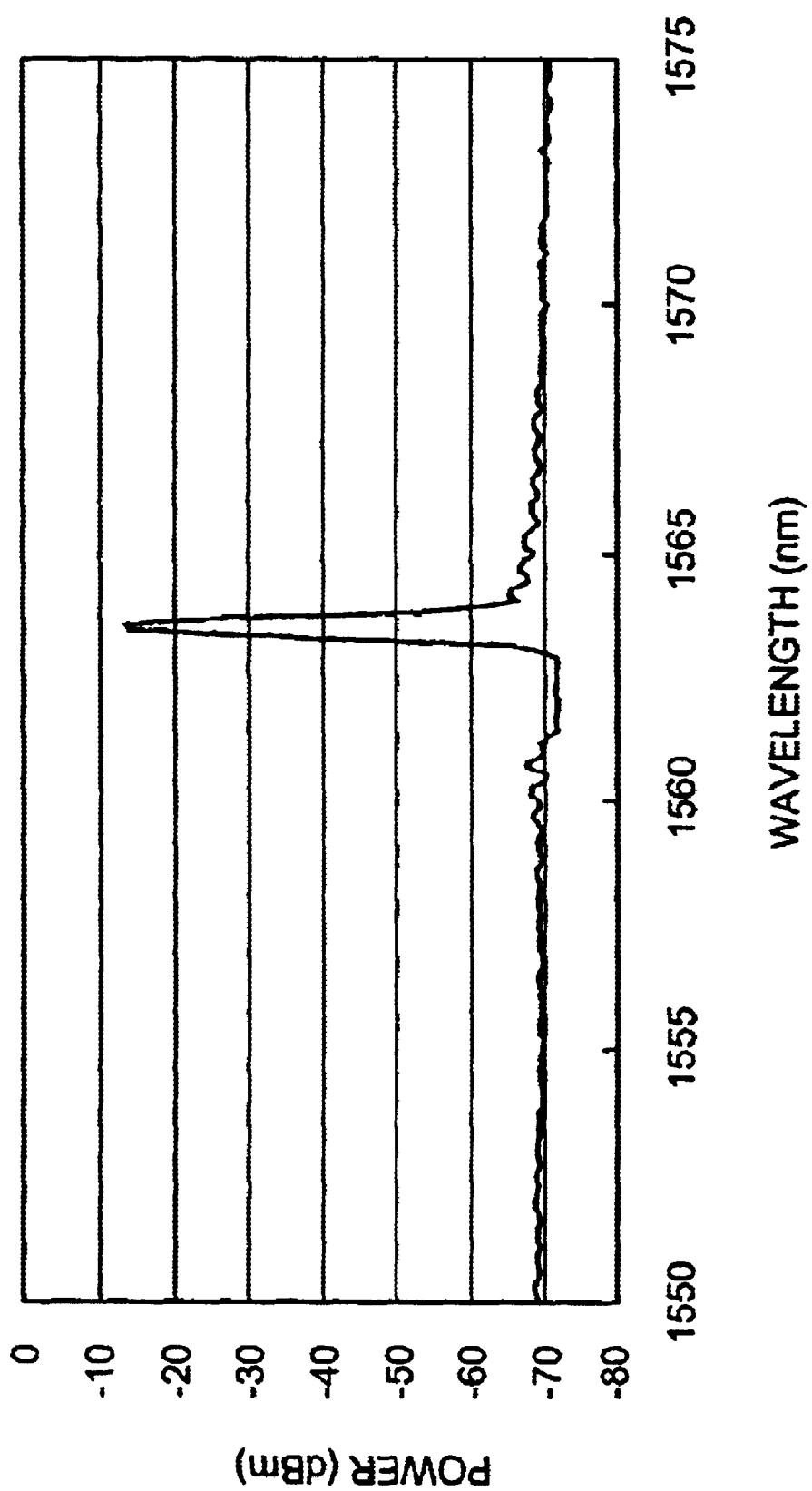
FIG. 4 is a plot of power versus wavelength spectrum for a DBR device of the present invention.

Turning now to FIG. 4, a graph of the power versus wavelength spectrum for an embodiment of a DBR device of the present invention is illustrated. The DBR includes a grating section approximately 550 microns long with a current-injection complex-coupled grating, and further includes a gain section approximately 100 microns long located directly adjacent to the grating section. In operation, the grating section was forward biased with a current of 100 mA, and the gain section was forward biased with a current of 40 mA. As is evident from FIG. 4, the device is characterized by a side-mode-suppression ratio (SMSR) of greater than 50 dB.

Figure 5:
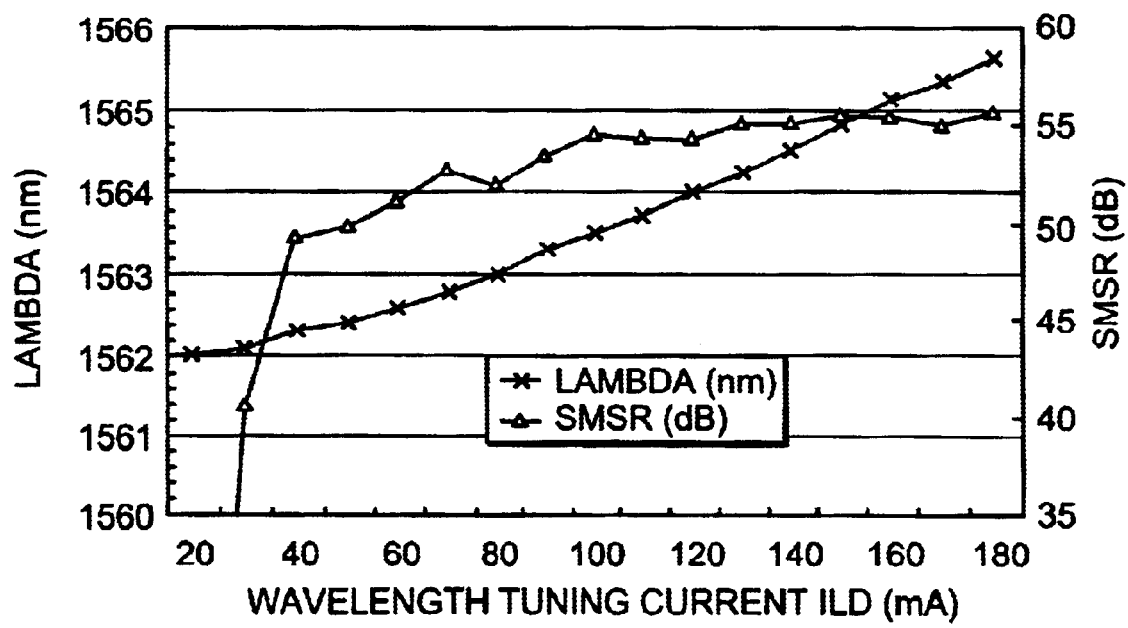
FIG. 5 is a plot of peak wavelength and SMSR versus current to the grating section for a DBR device of the present invention.

FIG. 5 is a plot showing peak wavelength and SMSR versus the current to the grating section for a DBR device of the present invention. From FIG. 5, it is apparent that the wavelength of the device can be tuned by changing the current to the grating section. In this example, the gain section current was fixed at 40 mA. From the plot of SMSR versus current, there are no significant drops in the SMSR, which indicates that no mode hops occurred as the device was wavelength tuned.

Figure 6:
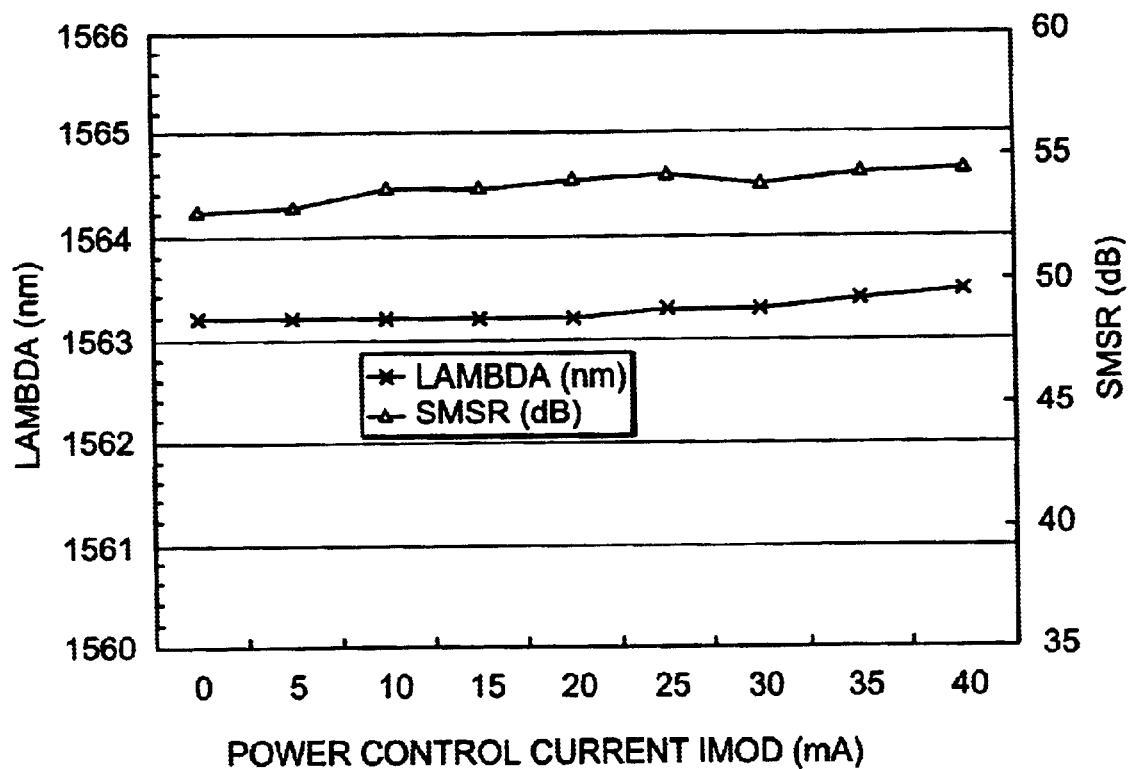
FIG. 6 is a plot of peak wavelength and SMSR versus current to the gain section for a DBR device of the present invention.

FIG. 6 shows a plot of wavelength and SMSR versus the current to the gain section of the DBR device. In this case, the current to the grating section was fixed at 100 mA, and the current to the gain section was varied from 0–40 mA. As in the example shown in FIG. 5, there are no dramatic changes in SMSR. This indicates that in the larger cavity including both grating and gain sections, the grating-stabilized wavelength dominates over the effect of preferred Fabry Perot modes. The laser can thus be continuously turned without jumping between Fabry Perot modes. Moreover, the relatively stable wavelength indicates that the function of the gain section (i.e. power) and the function of the grating section (i.e. wavelength tuning) are effectively separated.

Figure 7:
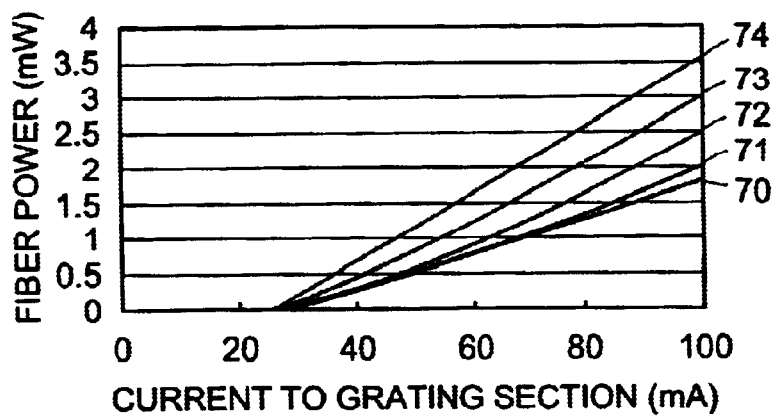
FIG. 7 is a plot of optical power versus current to the grating section and gain section for a DBR device and external modulator in accordance with the present invention.

In FIG. 7, the optical power from a packaged module (including a DBR and external modulator) was measured as a function of the current to the grating section and the gain section. The device was not optimized for separate wavelength control from the gain control. As shown in FIG. 7, the device operated smoothly without any dramatic kinks, which further evidences the absence of optical mode hopping. The curves correspond to gain section currents of 0, 10, 20, 30, and 40 mA, (reference numbers 70, 71, 72, 73, and 74, respectively), with the high gain section currents corresponding to the higher optical powers.

Process steps for fabricating the complex-coupled DFB laser device of FIG. 1 are now described. Reference is made to FIGS. 8A, 8B to 10A, 10B in the following description of process steps wherein side (A) and front (B) facet views are provided.

As shown in FIGS. 8A, 8B, an InP substrate and buffer layer, jointly designated 18A, lower cladding layer 32, active region including upper and lower carrier confinement layers and active layer, jointly designated 18A, and upper cladding layer 38 are formed using an epitaxial growth process, such as metalorganic chemical vapor deposition (MOCVD), using material compositions described above with reference to FIG. 1. A quaternary (InGaAsP) 1.1 μm layer 40A for the grating structure is formed on the upper cladding layer, followed by a thin layer of InP.

The current-injection complex-coupled grating is fabricated by depositing a photoresist over the grating section 111, and exposing the photoresist to a holographic pattern to provide spaced portions 20A for producing the grating. Following this step, a timed wet etch is used to make the grating, and the photoresist is then stripped.

As shown in FIGS. 9A, 9B, overgrowth begins with InP followed by an upper etch-stop layer 40 of InGaAsP, an additional layer of InP, band gap transition layer 42 of InGaAsP, and electrical contact layer 44 of p+-type InGaAs. Above electrical contact layer 44, a protection layer 47 of InP can be grown.

As shown in FIGS. 10A, 10B, the ridge waveguide is defined by first removing the protection layer 47 and depositing an $SiO_2$-A layer and photoresist. The photoresist is exposed with a ridge mask pattern followed by development and stripping of the photoresist. Using a dry etch ($CH_4/H_2$/Ar), the photoresist is etched down into the upper cladding layer 38. A wet etch using $HCl:H_3PO_4$ (1:3) is then done down through upper etch-stop layer 40 to further define the ridge 22A.

P-metals (e.g. Ti 400 Å/Pt 1000 Å/Au 2500 Å) are deposited on the InGaAs contact layer 44 over the regions corresponding to the grating section 111 and the gain section 112. If an implantation region is desired, a photoresist layer can be exposed to a proton implantation mask to define the region for implantation processing.

The device wafer is then thinned, and receives Au/Sn n-contact metal. The device can then be annealed to 410° C., cleaved into bars, and facet coated.

The DBR of the present invention can be used in combination with an external modulator, such as an electroabsorption modulator or a Mach Zehnder modulator, for modulating the output laser light. Typically, in such systems, the laser runs nominally in a continuous wave mode and an information signal is provided to the modulator.

Embodiments of an integrated electroabsorption modulated laser (EML) device, as well as an electroabsorption modulated partial grating laser (EMPGL) device, wherein the laser diode and modulator are integrated on a single substrate, are disclosed in commonly-owned U.S. patent application Ser. No. 09/809,725, filed Mar. 15, 2001, and entitled "ELECTROABSORPTION MODULATED LASER," by Randal A. Salvatore, Richard P. Sahara and Hanh Lu, the entire teachings of which are incorporated herein by reference.

While this invention has been particularly shown and described with references to preferred embodiments thereof, it will be understood by those skilled in the art that various changes in form and details may be made therein without departing from the scope of the invention encompassed by the appended claims.

What is claimed is:

1. An integrated semiconductor device, comprising:
   a semiconductor substrate;
   a wavelength-tunable laser on the substrate comprising a grating section adjacent to a gain section, the grating section having an active layer and a current-induced grating which modulates gain in the active layer in the direction of light propagation, and the gain section having an active layer, the grating section and the gain section consisting a laser cavity emitting light at a wavelength determined by the current-induced grating localized only within the grating section wherein the current-induced grating provides periodic modulation of the gain of the active layer and periodic modulation of a differential refractive index between the different indices of the active layer and of the current-induced grating:
   a first electrical contact over the grating section for providing current to the grating section to control the wavelength of light emitted from the laser; and
   a second electrical contact over the gain section for providing current to the gain section to control the output power of the light.

2. The semiconductor device of claim 1 wherein the laser is a distributed Bragg reflector (DBR) laser.

3. The semiconductor device of claim 1 further comprising an implantation region electrically isolating the grating section and the gain section.

4. The semiconductor device of claim 1 wherein the grating section comprises a strong gain coupled grating.

5. The semiconductor device of claim 1 wherein the grating section comprises a strong complex coupled grating.

6. The semiconductor device of claim 1 wherein the grating section comprises a strong current injection complex coupled grating.

7. The semiconductor device of claim 1 wherein the grating section is arranged to obtain a single longitudinal mode of operation of the laser.

8. The semiconductor device of claim 1 wherein the grating section is arranged to prevent optical mode hopping as the laser is wavelength-tuned.

9. The semiconductor device of claim 1 wherein the current-induced grating are not periodically spaced in at least one portion of the grating section comprising a fractional phase shift section between a plurality of periodically spaced sections.

10. The semiconductor device of claim 9 wherein the fractional phase shift section comprises a space that is larger than the space between the periodically spaced sections by about a quarter wave.

11. The semiconductor device of claim 10 wherein the grating section comprises a plurality of periodically spaced gratings and at least one fractional wave shifted grating.

12. The semiconductor device of claim 10 wherein the at least one fractional wave shifted grating comprises a quarter wave shifted grating.

13. The semiconductor device of claim 1 wherein the grating has a coupling strength product κL greater than 1.5, where L is the coupling coefficient and L is a length of the laser cavity.

14. A method of fabricating an integrated semiconductor device, comprising:
    forming on a semiconductor substrate a wavelength-tunable laser having a grating section adjacent to a gain section, the grating section having an active layer and a current-induced grating which modulates gain in the active layer in the direction of light propagation, and the gain section having an active layer, the grating section and the gain section consisting a laser cavity emitting light at a wavelength determined by the current-induced grating localized only within the grating section wherein the current-induced grating provides periodic modulation of the gain of the active layer and periodic modulation of a differential refractive index between the different indices of the active layer and of the current-induced grating;
    forming a first electrical contact over the grating section for providing current to the grating section to control the wavelength of light emitted from the laser; and
    forming a second electrical contact over the gain section for providing current to the gain section to control the output power of the light.

15. The method of claim 14 wherein the laser comprises a distributed Bragg reflector (DBR) laser.

16. The method of claim 14 further comprising forming an implantation region to electrically isolate the grating section and the gain section.

17. The method of claim 14 wherein the grating section comprises a strong gain coupled grating.

18. The method of claim 14 wherein the grating section comprises a strong complex coupled grating.

19. The method of claim 14 wherein the grating section comprises a strong current injection complex coupled grating.

20. The method of claim 14 wherein the current-induced grating are not periodically spaced in at least one portion of the grating section comprising a fractional phase shift section between a plurality of periodically spaced sections.

21. The method of claim 20 wherein the fractional phase shift section comprises a non-uniform spacing of an adjacent fractional wave shifted grating.

22. The method of claim 21 wherein the adjacent fractional wave shifted grating comprises a quarter wave shifted grating.

23. The method of claim 14 wherein the grating has a coupling strength product κL greater than 1.5, where κ is the coupling coefficient and L is a length of the laser cavity.

24. An integrated semiconductor device, comprising:
    a semiconductor substrate;
    a wavelength-tunable laser on the substrate comprising a grating section adjacent to a gain section, the grating section having an active layer and a grating with a coupling strength product κL greater than 1.5, where κ is a coupling coefficient and L is a length of a laser cavity, and the gain section having an active layer, the grating section and the gain section consisting the laser cavity having the length L emitting light at a wavelength determined by the current-induced grating localized only within the grating section wherein the current-induced grating provides periodic modulation of the gain of the active layer in the direction of light propagation and provides periodic modulation of a differential refractive index between the different indices of the active layer and of the current-induced grating;

a first electrical contact over the grating section for providing current to the grating section to control the wavelength of light emitted from the laser; and a second electrical contact over the gain section for providing current to the gain section to control the otuput power of the light.

25. The device of claim 24 wherein the grating comprises a strong complex coupled grating.

26. The device of claim 24 wherein the grating comprises a strong current-injection complex coupled grating.

27. The device of claim 24 wherein the grating comprises a fractional wave shifted grating.

28. The device of claim 24 wherein the grating comprises a quarter wave shifted grating.

29. The device of claim 24 wherein the grating section is arranged to obtain a single longitudinal mode of operation of the laser.

30. The device of claim 24 wherein the grating section is arranged to prevent optical mode hopping as the laser is wavelength-tuned.

31. The device of claim 24 wherein the gain section includes an implantation region electrically isolating the grating section and the rest of the gain section.

32. The device of claim 24 wherein the laser is a distributed Bragg reflector (DBR) laser.

33. A method of fabricating an integrated semiconductor device, comprising:

forming on a semiconductor substrate a wavelength-tunable laser having a grating section adjacent to a gain section, the grating section having an active layer and a grating with a coupling strength product $\kappa L$ greater than 1.5, where $\kappa$ is a coupling coefficient and L is a length of a laser cavity, and the gain section having an active layer, the grating section and the gain section consisting the laser cavity having the length L emitting light at a wavelength determined by the current-induced grating localized only within the grating section wherein the current-induced grating provides periodic modulation of the gain of the active layer in the direction of light propagation and provides periodic modulation of a differential refractive index between the different indices of the active layer and of the current-induced grating;

forming a first electrical contact over the grating section for providing current to the grating section to control the wavelength of light emitted from the laser; and forming a second electrical contact over the gain section for providing current to the gain section to control the output power of the light.

34. The method of claim 33 wherein the grating section comprises a strong gain coupled grating.

35. The method of claim 33 wherein the grating section comprises a strong complex coupled grating.

36. The method of claim 33 wherein the grating section comprises a strong current injection complex coupled grating.

37. The method of claim 33 wherein the grating section comprises a quarter wave shifted grating.

38. The method of claim 33 wherein the grating section comprises a fractional wave shifted grating.

39. The method of claim 33 further comprising implanting an implantation region in the gain section for electrically isolating the grating section and the rest of the gain section.

40. The method of claim 33 wherein the laser is a distributed Bragg reflector (DBR) laser.

* * * * *